United States Patent [19]
Baudisch

[11] Patent Number: 5,627,474
[45] Date of Patent: May 6, 1997

[54] CONTINUITY CHECKER FOR ALLOCATING INDIVIDUAL CORES OF MULTI-CORE CABLES

[75] Inventor: Peter Baudisch, Waeschenbeuren, Germany

[73] Assignee: Ch. Beha GmbH Technische Neuntwicklungen, Glottertal, Germany

[21] Appl. No.: 442,678

[22] Filed: May 17, 1995

[30] Foreign Application Priority Data

May 18, 1994 [DE] Germany .................. 44 17 351.2

[51] Int. Cl.$^6$ ................................................ G01R 31/02
[52] U.S. Cl. ..................... 324/539; 324/66; 324/540; 379/10; 379/26
[58] Field of Search ................... 324/66, 539, 540; 379/10, 12, 25, 26

[56] References Cited

U.S. PATENT DOCUMENTS

| | | | |
|---|---|---|---|
| 3,681,686 | 8/1972 | Connally | 324/66 |
| 3,891,811 | 6/1975 | Miller | 324/66 |
| 3,902,026 | 8/1975 | Rogers et al. | 324/66 |
| 4,224,690 | 9/1980 | Rockwell | 324/540 |
| 4,748,402 | 5/1988 | Sellati | 324/66 |
| 4,937,519 | 6/1990 | Fields, III | 324/66 |
| 4,937,529 | 6/1990 | O'Toole, III et al. | 324/66 |
| 4,992,739 | 2/1991 | Kosch | 324/66 |
| 5,027,074 | 6/1991 | Haferstat | 324/539 |
| 5,384,540 | 1/1995 | Dessel | 324/539 |

FOREIGN PATENT DOCUMENTS

| | | |
|---|---|---|
| 0088163 | 9/1983 | European Pat. Off. . |
| 3924763 | 7/1989 | Germany . |
| WO90/02341 | 3/1990 | WIPO . |
| WO92/21986 | 12/1992 | WIPO . |

OTHER PUBLICATIONS

"Kabael–Analyzer Testet Kabel bis 99 (255) Adern" by Von Dipl. Ing. Bernhard C. Zschocke, Elektor 1992, H.12, S.20–25, pp. 20–25.

*Primary Examiner*—Kenneth A. Wieder
*Assistant Examiner*—Diep Do
*Attorney, Agent, or Firm*—Nash & Associates; Gary M. Nath; Richard E. Campbell

[57] ABSTRACT

Proposed is a continuity tester for a plurality of electric conductors. For this purpose, a signal transmitter for admitting different individual identification signals to such conductors is connected to one of the ends of the conductors, whereby an identification is allocated to each signal transmitter connection. A signal receiver (10) for decoding the different identification signals by means of a decoding device (15) for indicating the allocated identification on a display (16) is connected to the other ends of the conductors. The signal receiver (10) has a sequence switchgear (30) supplying the connected conductors individually and successively with a reference potential in a repeated cycle, whereby the decoding device (15) for decoding the identification signals is formed at least on the one other conductor in each case. The signal transmitter has a signal generator generating for each of the signal transmitter connections the allocated identification signals multiple times, in a way such that no signal overlappings occur overall. A separate reference line can be completely omitted in this way, and the connected conductors to be tested can be simultaneously checked by means of the signal receiver (10), i.e., the respective identifications of said conductors are simultaneously indicated on the display (16).

17 Claims, 3 Drawing Sheets

CONTINUITY CHECKER FOR ALLOCATING INDIVIDUAL CORES OF MULTI-CORE CABLES

FIELD OF THE INVENTION

The invention relates to a continuity tester for a plurality of electric conductors, with a signal transmitter connectable to one of the ends of the conductors for admitting different individual identification signals to the conductors, whereby an identification is allocated to each signal transmitter connection, and with a signal receiver connectable to each of the other ends of the conductors for decoding the different identification signals by means of a decoding device for indicating each allocated identification on a display.

BACKGROUND OF THE INVENTION

Such a continuity tester especially serves for checking and allocating the individual cores of installed multi-core cables, for example telecommunication cables extending between a main line installed in a roadway, and building connections. For such a purpose, the signal transmitter is connected to the individual cores at the end of the cable, and the identification signals fed into the conductors by the signal transmitter are decoded and displayed by the signal receiver at the other end for allocation of the cores.

A conductor allocation tester LZT 16 of the type specified above is known from the trade publication ELV, No. 4, 1989. One of the two connections of the signal receiver is continuously supplied with a reference potential (e.g. mass) and has to be connected to a line or core, of which the opposite end is known. Said opposite end has to be connected to a corresponding reference connection of the signal transmitter. The other conductors can then be successively tested with the other connection of the signal receiver. The drawback of said known arrangement is, on the one hand, that one conductor among the conductors or cores to be tested has to be known with its two ends because it is required as a reference line. Only one single conductor can then be tested at a time in the following steps of the test. No identification of cross connections between the other conductors to be tested is possible.

Such a test arrangement is known from DE 39 24 763 A1, which has the same drawbacks, and which, furthermore, operates with analogous voltages via a resistance network. This causes problems in connection with very long conductors to be tested, whereby the number of conductors to be tested is limited by the fact that the differences in voltage in the tested lines become smaller and smaller.

The problem of the present invention is to enhance a continuity tester of the type specified above in such a way that no reference core is needed for the test, and that at least two conductors or cores can be tested in each step of the test.

SUMMARY OF THE INVENTION

According to the invention, said problem is solved in that the signal receiver has a sequence switchgear admitting a reference potential successively and individually into each of the connected conductors in a repeating cycle, whereby the decoding device for decoding the identification signals is formed in each case on at least the one other conductor; and that the signal transmitter has a signal generator generating the allocated identification signals several times for each of the signal transmitter connections, in a way such that no signal overlappings occur overall.

Due to the sequence switchgear, one conductor serves in each case alternately as the reference conductor, while at least the one other line is being measured. No fixed reference line is needed for that reason, i.e., for the measurement, the signal receiver can be applied to any unknown conductors, whereby the identification of all conductors is indicated. This means that preferably two conductors can be measured at the same time, which simplifies and accelerates the measuring operation. As no overlapping of identification signals can occur, it is also possible to decode conductors to which different identification signals are applied due to short circuits or cross connections. The identification of different identification signals can be advantageously used for detecting such short circuits or cross connections, and for indicating the conductors that are connected to each other, by decoding all identification signals. This substantially increases the versatility of the continuity tester.

Advantageous further developments and improvements of the continuity tester specified in claim 1 are possible through the measures specified in the dependent claims.

Preferably, the signal receiver has two conductor connections, and the sequence switchgear has two switches controllable in the push-pull mode, by which the reference potential is admitted to one of the conductor connections in each case, such reference potential being preset especially by the negative pole of the supply voltage. What is accomplished in a simple manner in this way is that the connected conductors alternately serve as reference lines. Since the conductor connections of the signal receiver are advantageously connected to the positive pole of the supply voltage via resistors, it is possible to simultaneously feed a supply voltage into the signal transmitter via the lines to be measured, which means that the signal transmitter does not require its own supply battery or a similar voltage source. A voltage supply device in the signal transmitter receiving electric energy via the lines connected to the signal receiver makes available the required operating voltage especially for the signal generator. Said voltage supply device is usefully designed as a multiple bridge rectifier so as to be capable of supplying the supply voltage irrespective of which lines are connected to the signal receiver at a given time.

As the signal generator, when forming the identification signals, is temporarily short-circuiting the two conductors to be tested, provision is made for a storage capacitor for maintaining the operating voltage, said capacitor being advantageously connected to the voltage supply device in the signal transmitter.

For the simple and efficient generation of the identification signals for the individual signal transmitter connections, the signal generator is connected to a corresponding number of controllable semiconductor switches, by which the respective signal transmitter connection can be applied to a signal potential changing the level of the signal, particularly to the reference potential, namely synchronously with the control signals of the signal generator presetting the identification signals. In this way, each identification signal is formed as a digital signal sequence, which permits testing a great number of conductors at the same time, and the lengths of the lines and the line resistance play only a minor role.

As the digital signal sequence contains at least one identification for the allocated signal transmitter connection and one identification for the respective signal transmitter, several signal transmitters with different signal transmitter identifications can be used at the same time in a cascade arrangement, which multiplies the maximum number of conductors to be tested.

In order to be able to display the identification of the conductors or cores and the identifications of the signal transmitters on a display, use is advantageously made of a reversing switch on the signal receiver, by which the identifications for the respective signal transmitter connections can be decoded and shown on the display in the one switching position, and the identifications for the allocated signal transmitters in another switching position. Instead of a reversing switch it is, of course, possible also to use additional display fields in order to be able to simultaneously display the identifications for the signal transmitter connections and the identifications for the signal transmitters.

The display usefully has a number of display windows corresponding with the number of conductor connections of the signal receiver, preferably two windows, so that the two identifications of the connected conductors or the identifications of the allocated signal transmitters can be displayed simultaneously.

So that short circuits can be displayed in an especially simple and informative way, the decoding device has means for identifying different signal sequences on a conductor connection that are allocated to more than one conductor, and control means for switching on a short-circuit light for indicating a short circuit between such conductors and for alternately displaying the respective identifications in one window of the display. Such alternating display thus makes it possible to indicate that a short circuit or a cross connection is present between which two conductors to be tested.

So that breaks can be clearly indicated as well, the decoding device has means for detecting any missing signal sequences on the conductor connections, and control means for switching on a break light. Finally, so that a test circuit, i.e. a short circuit can be detected between the two conductor connections or between the lines connected thereto, the decoding device has means for detecting a constant signal level, in particular the reference potential level on the conductor connections, and control means for switching on a test circuit light. For protecting them against voltages applied to the lines to be tested, the connections of the signal transmitter and/or signal receiver are fitted with overvoltage protection devices. In addition, provision is usefully made for an over-voltage indicator and an overvoltage light for detecting such an overvoltage on one of the lines to be tested.

The signal generator of the signal transmitter and/or the decoding device is/are usefully designed as a microcomputer, by which—if it is suitably small in its dimensions—the required signals and signal test processes can be generated and carried out in a comfortable and safe way.

DESCRIPTION OF THE DRAWINGS

An exemplified embodiment of the invention is explained in greater detail in the following specification and shown in the drawings, in which.

DETAILED DESCRIPTION OF THE INVENTION

Figure 1:
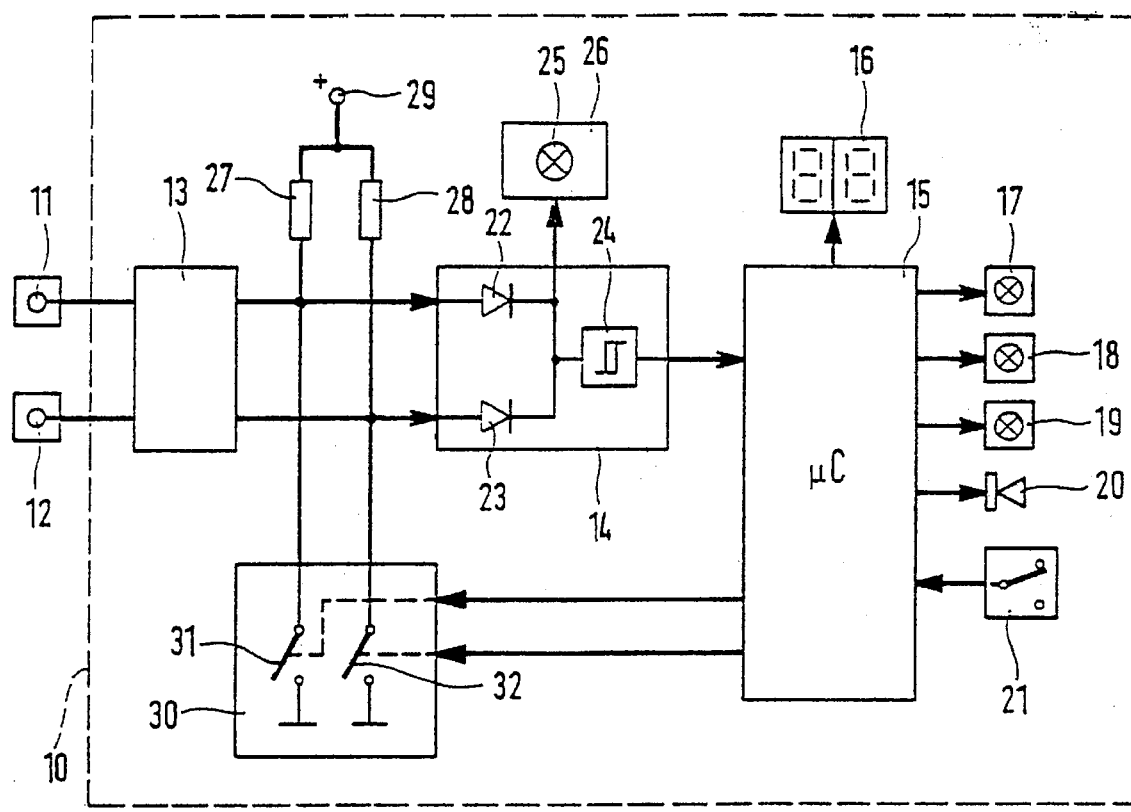
FIG. 1 shows a block circuit diagram of an exemplified embodiment of a signal receiver.

The signal receiver 10, which is shown in FIG. 1 as a block circuit diagram, has the two conductor connections 11, 12, to which there may be connected, for example test cables fitted with test tips. Said conductor connections 11, 12 are connected via an overvoltage protection device 13 and a signal processing circuit 14 to the input of a microcomputer 15, which is designed or programmed as the decoding device for the identification signals received. A two-digit display 16, a test circuit light 17, a short circuit light 18, a break light 19 and a sound signal transmitter 20 are connected to control outputs of said microcomputer 15. Furthermore, a reversing switch 21 is connected to a control input of the microcomputer 15.

In the signal processing circuit 14, the signal sequences received via the line connections 11, 12 are combined by means of the two diodes 22, 23, whose cathodes are connected to each other and to an input of a Schmitt-trigger 24. The output of the Schmitt-trigger forms at the same time the output of the signal processing circuit 14. Furthermore, the cathodes 22, 23, which are connected to each other, are connected to an overvoltage indicator 26 having an overvoltage light 25.

Of course, another known signal processing stage can be used instead of the Schmitt-trigger 24.

The two connection lines between the overvoltage protection device 13 and the signal processing circuit 14 are connected via the resistors 27, 28 to the positive pole 29 of a supply voltage source (not shown), which, for example can be a battery. Furthermore, said two lines are connected to a test circuit 30, which substantially has the two controllable semiconductor switches 31, 32, which are alternately actuated by the microcomputer 15, and which alternately connect the two lines to the negative pole of the supply voltage source, which presets the reference potential.

Figure 2:
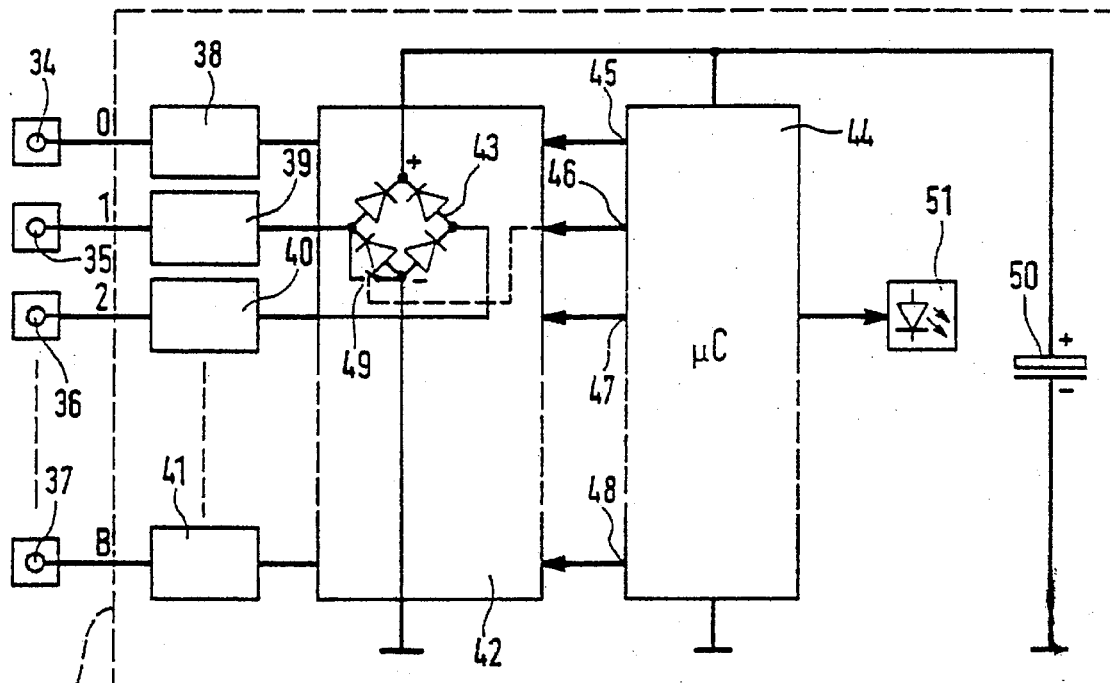
FIG. 2 shows a block circuit diagram of an exemplified embodiment of a signal transmitter.
Figure 3:
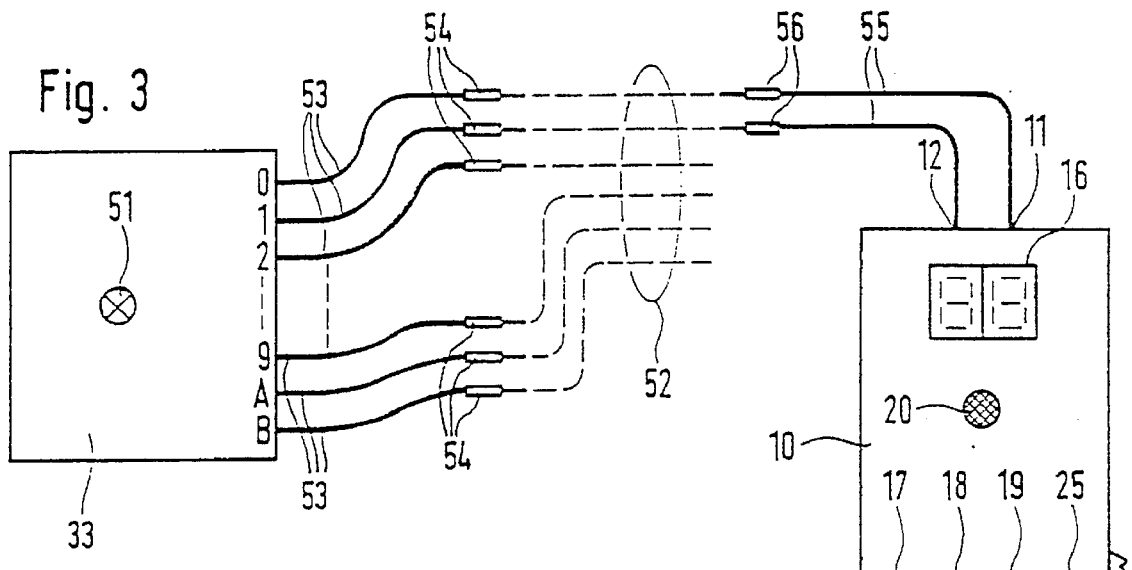
FIG. 3 shows a view of the signal transmitter and signal receiver shown in FIGS. 1 and 2, respectively, as the test is being conducted.

The signal transmitter 33 shown in FIG. 2 in the form of a block circuit diagram has a great number of signal transmitter connections 34 to 37, of which only four are shown for the sake of simplicity. It is possible to make provision for, for example twelve signal transmitter connections, which according to FIG. 3 are denoted by the hexadecimals O to B. Said numbers preset the identification for the signal transmitter connections. Said signal transmitter connections 34 to 37 are connected via the overvoltage protection devices 38 to 41 to a voltage supply device 42, which is substantially designed as a multiple bridge rectifier. For the sake of simplification, only one single bridge rectifier 43 is shown for the signal transmitter connection 35. Said bridge rectifier 43 (and, of course, the bridge rectifiers not shown as well) supplies at its positive and negative connections the supply voltage for a signal generator 44, which is designed as a microcomputer. Said signal generator 44 generates an individual signal sequence for each of the signal transmitter connections 34 to 37. Said signal sequence contains in each case a starting sequence (e.g. 1 bit), a signal transmitter identification (e.g. 4 bits), a core identification (e.g. 4 bits), and a test character (e.g. 4 bits). The signal transmitter identification is the same for all signal sequences of said signal transmitter, whereas an individual core identification is applied to each of the signal transmitter connections 34 to 37, such identifications being allocated to the identifications O–B. If several signal transmitters are used, each other signal transmitter again has the same core identification, but another signal transmitter identification.

The control outputs 45 to 48 of the signal generator 44, which are allocated to the signal transmitter connections 34 to 37, each control a semiconductor switch, of which only one (semiconductor switch 49) is shown for the sake of simplification. Said semiconductor switch bridges the diode of the bridge rectifier 43 that connects the allocated signal transmitter connection 35 to the negative connection of the supply voltage, hence to the reference potential. During testing of a line that is connected to the signal transmitter connection 35, positive potential is applied to such line via one of the resistors 27, 28. When the semiconductor switch 49 is closed because a control signal is applied to the control output 46, the positive potential applied to the line to be tested changes to the reference potential. In this way, the individual signal sequences with the specified identifications are generated.

Figure 7:
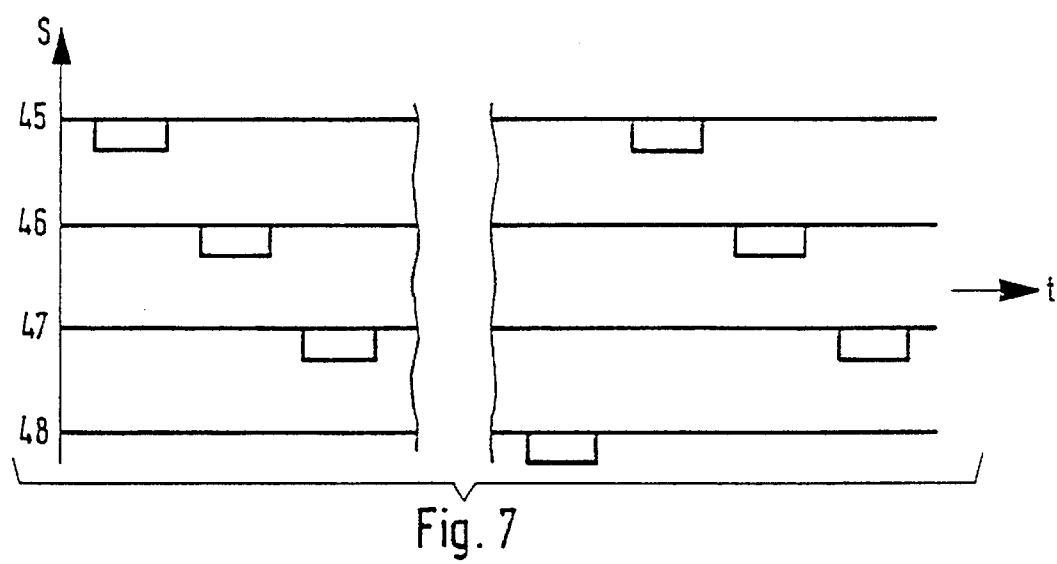
FIG. 7 shows a signal diagram for illustrating the generation of the signal sequences in the signal transmitter, such sequences containing the identification signals.

The signal sequences generated at the control outputs 45 to 48, such sequences containing identifications, are shown in FIG. 7 with their time sequence. As the other control outputs disposed between the control output 47 and the control output 48 are not shown for the sake of simplification, their signals are characterized in FIG. 7 by a time gap. Important is that the signal sequences are generated in each case successively in terms of time and not overlapping, so that only one signal is always applied simultaneously to one of the control outputs 45 to 48 and thus to the lines to be tested. Said signal sequences are generated continuously, i.e., they always repeat themselves with the same sequence (as shown in FIG. 7) or with another sequence.

As the voltage supply would be short-circuited on the side of the signal receiver 10 as the semiconductor switch 49 or another corresponding semiconductor switch (not shown) is being controlled, a storage capacitor 50 connected in parallel with the voltage supply device 42 serves for maintaining the operation of the signal generator 44 during that time.

An overvoltage light 51 connected to a control output of the signal generator 44 and designed as an LED serves for indicating an overvoltage on one of the lines connected to the signal transmitter connections 34 to 37, which lines are to be tested. For this purpose, the signal generator 44 designed as a microcomputer also contains an overvoltage indicator, which translates any increase in the supply voltage applied into a corresponding control signal for the overvoltage light 51. Such increase in the voltage, however, can occur only within a small range, as it is limited by the overvoltage protection devices 38 to 41. Alternatively, the overvoltage light 51 can be connected also in series with a resistor to the supply connections of the signal generator 44. The operating voltage during a normal operation amounts to about 4 volts, and the overvoltage lamp is illuminated starting at about 5 volts.

Figure 4:
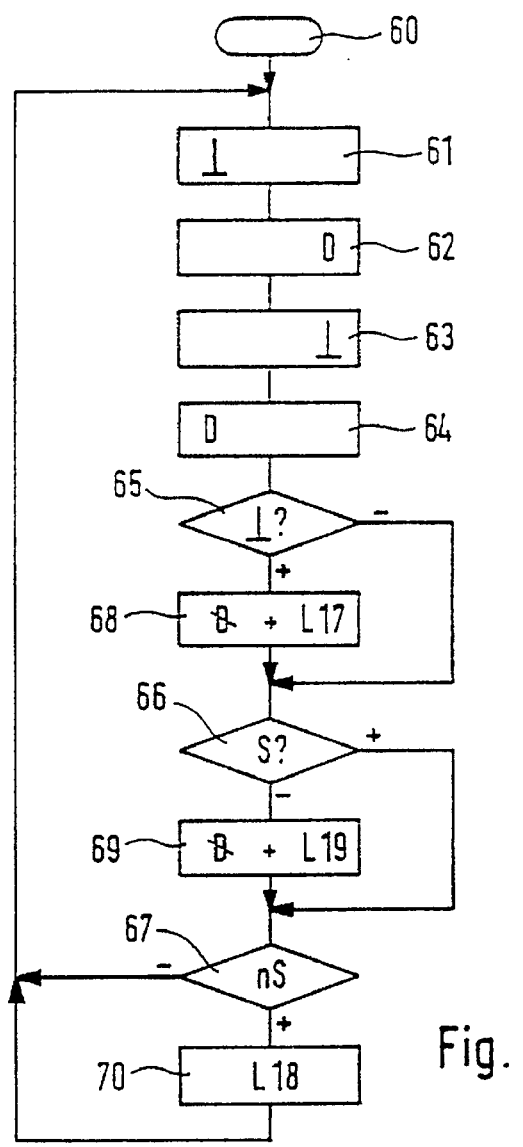
FIG. 4 shows a flow diagram for explaining the mode of operation of the functions in the signal receiver.

For testing a cable or a cable arrangement 52, the individual cores are first connected at one end to the signal transmitter connections of the signal transmitter 33 (according to FIG. 3). For said purpose, said signal transmitter connections with the identifications O–B are connected to the connection lines 53, which on their ends are fitted with the plugs 54 or terminal devices for the connection to the cores to be tested. The line connections 11, 12 of the signal receiver 10 are accordingly fitted with the test lines 55, which at their ends are also equipped with the plugs 56 or with test tips or test terminals. First, any two cores are connected at the other end of the cable arrangement 52 (to be tested) to the two test lines 55 and thus to the conductor connections 11, 12. The mode of operation of the test procedure is now explained in the following by reference to the flow diagram shown in FIG. 4, which reflects the functional sequences in the microcomputer 15.

Following the program start 60 and the usual initialization, the semiconductor switch 31 is first closed in step 61, so that the signal sequences applied to the core that is connected to the conductor connection 12 are supplied to the microcomputer 15 via the diode 23 and the Schmitt trigger 24. In the microcomputer, said signal sequences are decoded in step 62 and the corresponding identification of the signal transmitter connection of the signal transmitter 33 connected to said core is displayed in the left window of the display 16. Now, in step 63, the semiconductor switch 31 is opened and the semiconductor switch 32 is closed. In this way, the signal sequences applied to the core connected with the line connection 11 are now received by the microcomputer 15 via the diode 22 and the Schmitt trigger 24. In the microcomputer, the identification signals of the respective core are now decoded again in step 64, and the corresponding identification appears in the right window of the display 16. In this way, both identifications are displayed simultaneously, such identifications being received by the signal receiver from two signal transmitter connections of the signal transmitter 33 via the cores to be tested.

Now follow the three test steps 65 to 67 for checking for irregular conditions. First, in step 65, it is tested whether a test circuit is present, i.e., whether the cores connected to the line connections 11, 12 are connected to each other. In this case, the reference potential would be applied to the anodes of the two diodes 22, 23. If the microcomputer 15 detects this condition, it cancels the display 16 in step 68 and switches the test circuit light 17 on. In test step 66, it is tested whether any signal sequences are still received via one of the line connections 11, 12. If this is not the case, this indicates a break in the line because the current supply for the signal transmitter is interrupted in this case and the latter can no longer generate any signal sequences. Therefore, if it is found that no further signal sequences occur, the microcomputer 15 switches the display off in step 69 and switches the break light 19 on. Finally, in test step 67 it is tested whether different signal sequences occur on one of the line connections 11, 12. This would be the case if the connected core would have a short circuit or a connection with another, third core that is connected to another signal transmitter connection of the signal transmitter. In this case, the microcomputer 15 switches the short circuit light 18 on in step 70. At the same time, the two identifications of the connected cores are alternately displayed in the corresponding window of the display 16, as will be explained in greater detail in connection with FIG. 5.

Figure 5:
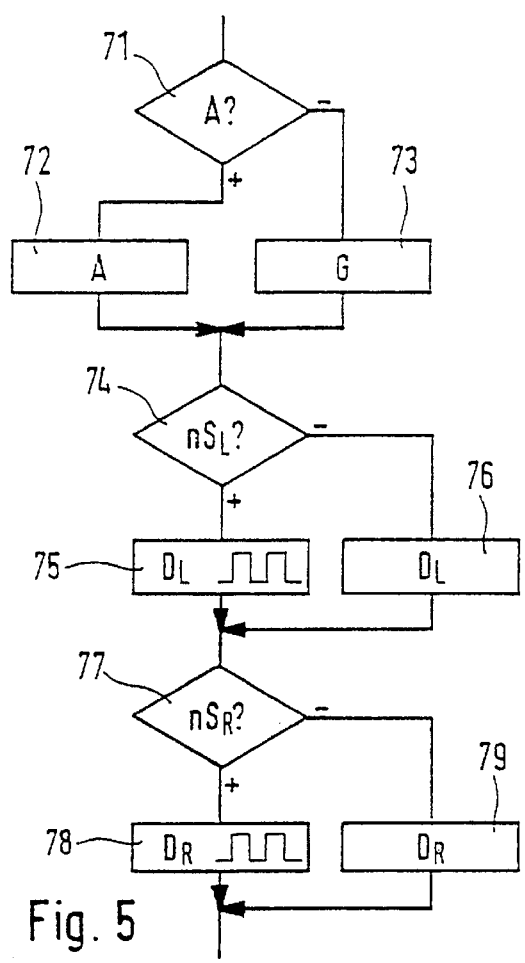
FIG. 5 shows a flow diagram for explaining the mode of operation by which the identifications are indicated on the display.

The flow diagram shown in FIG. 5 serves for illustrating the display reproduction. In the description of the flow diagram according to FIG. 4 it was first assumed that the reversing switch 21 is in a switching position in which the identification of the two cores of the cable arrangement 52—said cores being connected to the plugs 56—is reproduced on the display 16. However, it is in fact possible to reproduce on the display 16 also the identification of the signal transmitter to which the core to be tested is connected. Therefore, in FIG. 5, the switching position of the reversing switch 21 is queried first in test step 71. If said switch is in the core identification (A) switching position, the core identifications are decoded in the microcomputer 16 in step 72 and displayed, whereas the transmitter signal identifications (G) are decoded and displayed in the other switching position by the step 73. For this purpose, it is tested in the next test step 74 whether different signal sequences of different signal transmitter connections are present on the core to be tested, said core being connected to the left line connection 12. If this is the case, the decoded identifications are alternately displayed in the left window of the display 16 according to step 75. Otherwise one single identification is displayed in the left window according to step 76. Corresponding steps 77 to 79 are now repeated for signal sequences on the right line connection 11, leading to an alternating or constant display in the right window of the display 16.

According to FIG. 3, two cores of the cable arrangement 52 are connected to the first two signal transmitter connections of the signal transmitter 33, said connections having the identifications 0 and 1. When said cores are tested by the signal receiver 10, the identifications 0 and 1 thus appear on the display 16 provided the reversing switch 21 is in the switching position for the core identification. When the reversing switch 21 is reversed to signal transmitter identification, the identifications 1 and 1 appear on the display 16 provided the signal transmitter 33 has the identification 1. If, for example, the cores connected to the plugs 56 had a short circuit with other cores that are connected, for example to the signal transmitter connections of identifications A and B of another signal transmitter with the signal transmitter identification 2, the alternating indication 0 and A would appear in the display windows of the display 16 on the right side, and on the left side the alternating indication 1 and B when the reversing switch 21 is in the switching position for core identification, and the alternating displays 1 and 2 when said switch is in the other switching position.

Of course, the reversing switch 21 can be replaced also by a four-digit display, with provision made for two display windows for core identification and two windows for the signal transmitter identification. Furthermore, it is possible also to provide the signal receiver 10 with a greater number of line connections, for which a correspondingly greater number of display windows is required so as to be able to simultaneously display the identifications of all cores connected to the line connections.

The overvoltage indicator 26 in the signal receiver 10 responds at a voltage value above the battery supply voltage. The overvoltage protection device 13 limits any externally applied overvoltage to a value that is slightly above the value of the supply voltage and above the response threshold of the overvoltage indicator 26. Therefore, if one of the cores to be tested is live with a voltage above the response threshold of the overvoltage indicator 26, the overvoltage light 25 is switched on. A warning signal is triggered at the same time by the sound signal transmitter 20, which can also be omitted in a simpler system. It is possible also to generate the sound warning signal only when a external dc voltage is present, and to switch on only the visual display when an ac voltage is present.

Figure 6:
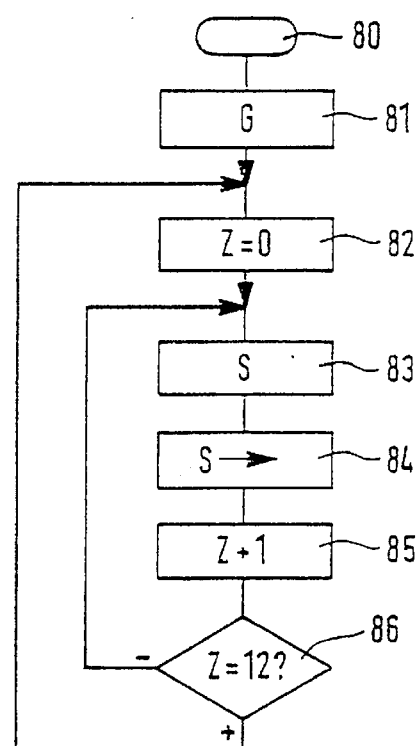
FIG. 6 shows a flow diagram for explaining the functions in the signal transmitter.

The flow diagram shown in FIG. 6 serves for illustrating the functional sequences in the signal transmitter 33 and signal generator 44.

Following the program start 80, the own transmitter identification is first read out from the internal memory in step 81. Subsequently, in step 82, a core counter is set to the value Z=0. Thereafter, the signal sequences that are to be issued on the first output with identification 0 are prepared as data telegrams. As explained in the foregoing, such data telegrams consist of a start sequence, the signal transmitter identification, the applicable core identification and a test character. In the subsequent step 84, said data telegram prepared in step 83 is then serially applied to the first signal transmitter connection 34 with identification 0 with a repeated sequence. The reading of the counter is subsequently increased by the value 1 in step 85. In the following test step 86, it is then queried whether the reading of the counter has already reached the value 12, whereby it is assumed here that twelve signal transmitter connections are present. With another number of signal transmitter connections, this number changes accordingly. As this value has not yet been reached at the start, the step sequences 83 to 86 are repeated until the reading of the counter has reached 12. In this process, the respective signal sequences are serially issued successively at the control outputs 45 to 48 of the signal generator 44 as shown in FIG. 7. As explained above, this then leads to corresponding data telegrams at the signal transmitter connections 34 to 37. Upon reaching the counter reading 12, the described processes repeat themselves after the counter has been reset to the counter reading 0 in step 82.

I claim:

1. A continuity checker for allocating individual cores of multi-core cables having a plurality of conductors, each conductor having a first end and a second end, said continuity checker comprising:

a signal transmitter means for applying different identification signals into each of said plurality of conductors, said signal transmitter means including a signal generator for generating said identification signals and applying said signals to each first end of said plurality of conductors multiple times with no signal overlapping; and signal receiver means capable of being connected to the second ends of said plurality of conductors for decoding the different identification signals, said signal receiver means including a decoding device for representing an allocated identification signal on a visual display, said signal receiver further including a sequential switching device for supplying the connected conductors individually and successively with a reference potential in a repeated cycle.

2. Continuity tester according to claim 1, characterized in that the signal receiver (10) has two conductor connections (11, 12), and that the sequential switching device (30) has two switches (31, 32) controllable in the push-pull mode, by which one of the conductor connections (11, 12) is in each case supplied with the reference potential, the reference potential being preset especially by the negative pole of the supply voltage.

3. Continuity tester according to claim 1 characterized in that the conductor connections (11, 12) of the signal receiver (10) are connected to the positive pole (29) of the supply voltage via resistors (27, 28).

4. Continuity tester according to claim 3, characterized in that the signal transmitter (33) has a voltage supply device (42), the voltage supply device receiving electric energy via the conductors connected to the signal receiver (10).

5. Continuity tester according to claim 4, characterized in that the voltage supply device (42) is substantially designed as a multiple bridge rectifier (43).

6. Continuity tester according to claim 4 characterized in that the voltage supply device (42) has a storage capacitor (50).

7. Continuity tester according to claim 1, characterized in that the signal generator (44) for generating the identification signals for the individual signal transmitter connections (34 to 37) is connected to a corresponding number of controllable semi-conductor switches (49), by which the signal transmitter connection (34 to 37) is in each case applicable to a signal potential changing the signal level, particularly to the reference potential, namely synchronously with the control signals of the signal generator (44) presetting the identification signals.

8. Continuity tester according to claim 7, characterized in that each identification signal is designed as a digital signal sequence.

9. Continuity tester according to claim 8, characterized in that the digital signal sequence contains at least one identification for the allocated signal transmitter connection (34 to 37) and one identification for the respective signal transmitter (33).

10. Continuity tester according to claim 9, characterized in that the signal receiver (10) has a reversing switch (21) by which, in one switching position, the identification for the signal transmitter connections (34 to 37) are decoded and indicated on the display (16), and the identifications for the allocated signal transmitters (33) in another switching position.

11. Continuity tester according to claim 1, characterized in that the display (16) has a number of display windows conforming to the number of conductor connections (11, 12) of the signal receiver (10).

12. Continuity tester according to claim 11, characterized in that the decoding device (15) has means for recognizing on a conductor connection (11, 12) different signal sequences allocated to more than one conductor, and control means for switching on a short-circuit light (18) for detecting a short circuit between said conductors, and for alternately displaying the respective identifications in a display window of the display.

13. Continuity tester according to claim 1, characterized in that the decoding device (15) has means for detecting the missing of any signal sequences on the conductor connections (11, 12), and control means for switching on a break light (19).

14. Continuity tester according to claim 1, characterized in that the decoding device (15) has means for detecting a constant signal level, in particular the reference potential level on the conductor connections (11, 12) and control means for switching on a test circuit light (17).

15. Continuity tester according to claim 1, characterized in that the connections (34 to 37; 11, 12) of the signal transmitter (3) and/or the signal receiver (10) are equipped with overvoltage protection devices (38 to 41; 13).

16. Continuity tester according to claim 15, characterized in that provision is made for an overvoltage indicator (26) and an overvoltage light (25; 51) for detecting an overvoltage on one of the conductors to be tested.

17. Continuity tester according to claim 1, characterized in that the signal generator (44) of the signal transmitter (33) and/or the decoding device (15) of the signal receiver (10) is/are designed as microcomputer(s).

* * * * *